(12) United States Patent  
Marotta

(10) Patent No.: US 7,034,587 B2
(45) Date of Patent: Apr. 25, 2006

(54) CONDITIONED AND ROBUST ULTRA-LOW POWER POWER-ON RESET SEQUENCER FOR INTEGRATED CIRCUITS

(75) Inventor: Giulio Giuseppe Marotta, Contigliano (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/157,267

(22) Filed: Jun. 21, 2005

(65) Prior Publication Data

US 2005/0231245 A1 Oct. 20, 2005

Related U.S. Application Data

(63) Continuation of application No. 10/229,920, filed on Aug. 28, 2002, now Pat. No. 6,924,676.

(30) Foreign Application Priority Data

Aug. 30, 2001 (IT) .......................... RM2001A0522

(51) Int. Cl.
*H03L 7/06* (2006.01)
(52) U.S. Cl. ..................................... 327/143
(58) Field of Classification Search ................. 327/143
See application file for complete search history.

(56) References Cited

U.S. PATENT DOCUMENTS

| | | | |
|---|---|---|---|
| 4,385,243 A | 5/1983 | Suzuki | |
| 4,428,022 A | 1/1984 | Engel et al. | |
| 4,539,489 A | 9/1985 | Vaughn | |
| 4,885,476 A | 12/1989 | Mahabadi | |
| 5,180,926 A | 1/1993 | Skripek | |
| 5,602,502 A * | 2/1997 | Jiang | 327/143 |
| 5,686,847 A | 11/1997 | Stubbe et al. | |
| 5,767,710 A | 6/1998 | Cho | |
| 5,801,561 A | 9/1998 | Wong et al. | |
| 6,016,068 A | 1/2000 | Ding | |
| 6,076,172 A | 6/2000 | Kimura et al. | |
| 6,077,717 A | 6/2000 | McBride | |
| 6,118,315 A | 9/2000 | Guedj | |
| 6,160,431 A | 12/2000 | Crotty | |
| 6,204,703 B1 | 3/2001 | Kwon | |
| 6,259,286 B1 | 7/2001 | Papaliolios | |
| 6,351,109 B1 | 2/2002 | Yoshida | |
| 2001/0048328 A1 | 12/2001 | Sato | |
| 2002/0011883 A1 | 1/2002 | Yamazaki et al. | |
| 2003/0020525 A1 | 1/2003 | Shigemasa | |

* cited by examiner

*Primary Examiner*—Quan Tra
(74) *Attorney, Agent, or Firm*—Leffert Jay & Polglaze, P.A.

(57) ABSTRACT

A power-on reset (POR) circuit determines when integrated circuit voltages and/or currents have reached predetermined levels and provides trigger signals to control the POR transition of the integrated circuit.

36 Claims, 4 Drawing Sheets

CONDITIONED AND ROBUST ULTRA-LOW POWER POWER-ON RESET SEQUENCER FOR INTEGRATED CIRCUITS

RELATED APPLICATIONS

This application is a continuation of U.S. patent application Ser. No. 10/229,920, filed Aug. 28, 2002, now U.S. Pat. No. 6,924,676 and titled "CONDITIONED AND ROBUST ULTRA-LOW POWER POWER-ON RESET SEQUENCER FOR INTEGRATED CIRCUITS," which is commonly assigned and incorporated by reference in its entirety herein. This application further claims priority to Italian Patent Application Serial No. RM2001A000522, filed Aug. 30, 2001, entitled "CONDITIONED AND ROBUST ULTRA-LOW POWER POWER-ON RESET SEQUENCER FOR INTEGRATED CIRCUITS," which is commonly assigned.

TECHNICAL FIELD

The present invention relates generally to Power-On-Reset circuits, in particular, to Power-On-Reset circuits employed in flash memory integrated circuits where one or more power supplies must reach predetermined output levels before the POR circuit transitions.

BACKGROUND

Almost all integrated circuits (ICs), and, in particular, flash memory ICs, have an internal Power-On-Reset circuit (POR) to reset all circuits before the IC begins to operate. Traditional POR circuits can malfunction, however, and cause incorrect operation of the integrated circuit, if the reset operation is allowed to take place before voltage and current sources and signals of the integrated circuit have reached their nominal levels. In particular, internal power supplies generated by charge pumps need time to set their output voltages to the correct level. In addition, in the case of flash memories used in cellular phones and in other applications requiring very low power consumption, the POR must operate at values of Vcc as low as 1.65 V, and POR power consumption must be eliminated or at least minimized once the reset operation is completed. Moreover, the POR circuit must be robust enough to work properly regardless of the slope of the Vcc ramp.

For the reasons stated above and for additional reasons stated hereinafter, which will become apparent to those skilled in the art upon reading and understanding the present specification, there is a need in the art for a conditioned and robust ultra-low power power-on reset circuit for very low voltage flash memory.

SUMMARY

The above-mentioned problems with traditional POR circuits and other problems are addressed by the present invention, at least in part, and will be understood by reading and studying the following specification.

A POR sequencer circuit is disclosed. The POR sequencer circuit of the present invention includes a sensing circuit, a delay circuit and a switching circuit. The sensing circuit determines when circuit voltages and/or currents of an integrated circuit have reached predetermined levels and provides trigger signals. The delay circuit introduces a delay in at least one trigger signal to ensure that other circuit elements of the integrated circuit had have sufficient time to reach their nominal levels before a POR reset signal transition takes place. The switching circuit reads signals from the sensing circuitry and the delay circuit and generates a signal for operating a power-on reset signal.

In another embodiment a method for providing a power-on reset signal to a circuit includes sensing when circuit voltages and/or currents have reached predetermined levels and providing trigger signals. The invention further provides apparatus and methods of varying scope.

Although, various embodiments have been illustrated using particular electronic components it will be understood by those of ordinary skill in the art that other circuit elements could be implemented and that the present invention is not limited to the arrangement of circuit elements disclosed. Moreover, it will also be understood in the art that the present invention could be applied to a power-on reset circuit for devices other than flash memory or flash memory that operates on very low supply voltages. Therefore, the present invention is not limited to a POR circuit for very low voltage flash memory.

DETAILED DESCRIPTION

Figure 1:
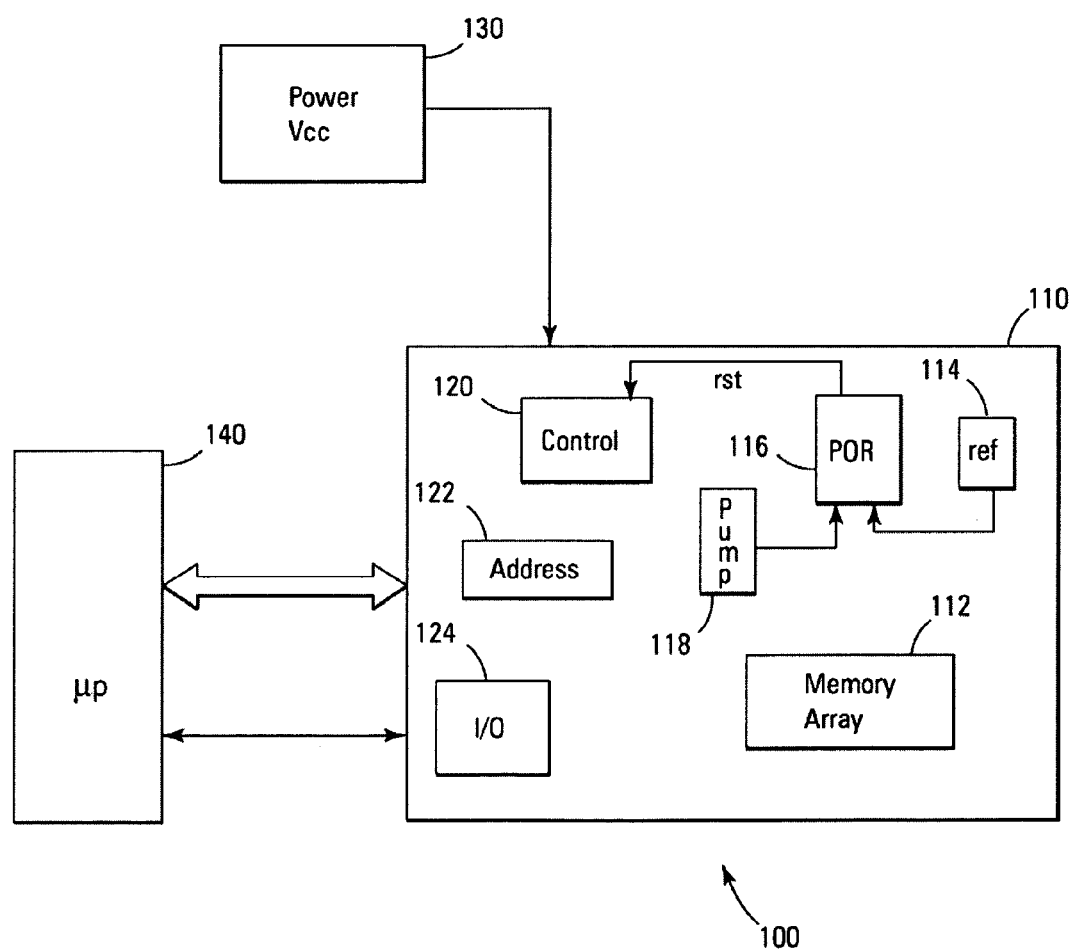
FIG. 1 is a block diagram of a memory circuit coupled to a processor and a voltage supply according to an embodiment of the invention.

FIG. 1 shows a computer system 100 including a memory circuit 110, a power supply 130 and a processor 140. Memory 110 includes a memory array 112 of nonvolatile memory cells (which can be flash memory cells), an on-chip reference voltage source 114, a power-on reset circuit 116, a pump 118 for providing elevated voltages for read, write and erase operations, and so forth, and a controller 120 that controls detailed operations of memory 110 such as the various individual steps necessary for carrying out writing, reading, and erasing operations. Memory 110 also includes an address decoder circuit 122 for decoding and selecting addresses provided by processor 140 to access appropriate memory cells in memory array 112, and an I/O circuit 124 for providing bi-directional communications between processor 140 and memory circuit 110.

In general, when the supply voltage, Vcc, starts to ramp toward its nominal value in a flash memory circuit, some signals remain at or near "0," while others follow the Vcc ramp. Although the nominal voltage for the logic "1" level is not yet reached, such signals may be considered to have reached a logic "1" during the ramp up. The reset signal, rst, inherently follows Vcc thereby resetting the memory during the Vcc ramp up. One purpose of the present invention is to transition the rst signal from "1" to "0," ending the reset of the whole flash memory, or other integrated circuit, only after other signals such as Vcc and vread are properly set for correct memory operation.

Figure 2:
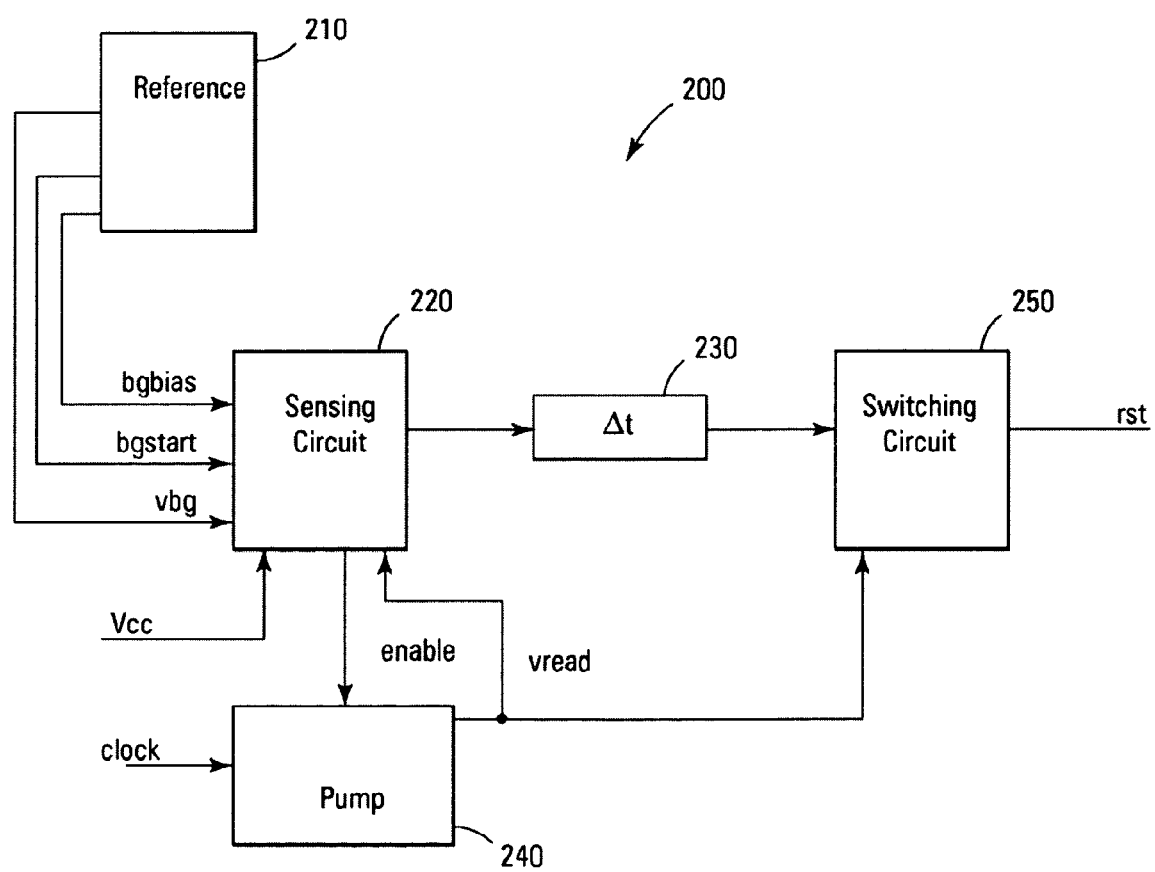
FIG. 2 is a simplified block diagram of a POR reset sequencer circuit according to an embodiment of the invention.

Referring to FIG. 2, a simplified functional block diagram of one embodiment of the present invention is described. The POR reset circuit 200 includes voltage reference 210, sensing circuit 220, delay circuit 230, pump 240 and switching circuit 250. Voltage reference 210 may be a low voltage flash memory voltage reference or other voltage reference in use in many integrated circuits. Sensing circuit 220 senses when reference voltages have reached certain predetermined values. Delay circuit 230 introduces a delay in signal output from the sensing circuit to provide time for internal and external power supply voltages to reach their nominal values. Pump 240 generates a vread signal used to read memory elements. Switching circuit 250 outputs a rst signal in response to signals from sensing circuit 220, delay circuit 230 and pump 240.

In general, a POR circuit according to the present invention operates as follows. The rst signal is allowed to transition from "1" to "0" only after several events have occurred: sensing circuit 220 has determined that voltages from voltage reference 210 have turned on or reached certain values, pump 240 has output vread after being enabled by a signal from sensing circuit 220, vread has reached a predetermined value, the delay of delay circuit 230 has elapsed providing a delayed activation signal to switching circuit 250 and Vcc has reached a certain predetermined value. After rst transitions, power consuming elements of switching circuit 250 automatically switch off to minimize current consumption of the POR reset circuit when it is not in operation.

Figure 3:
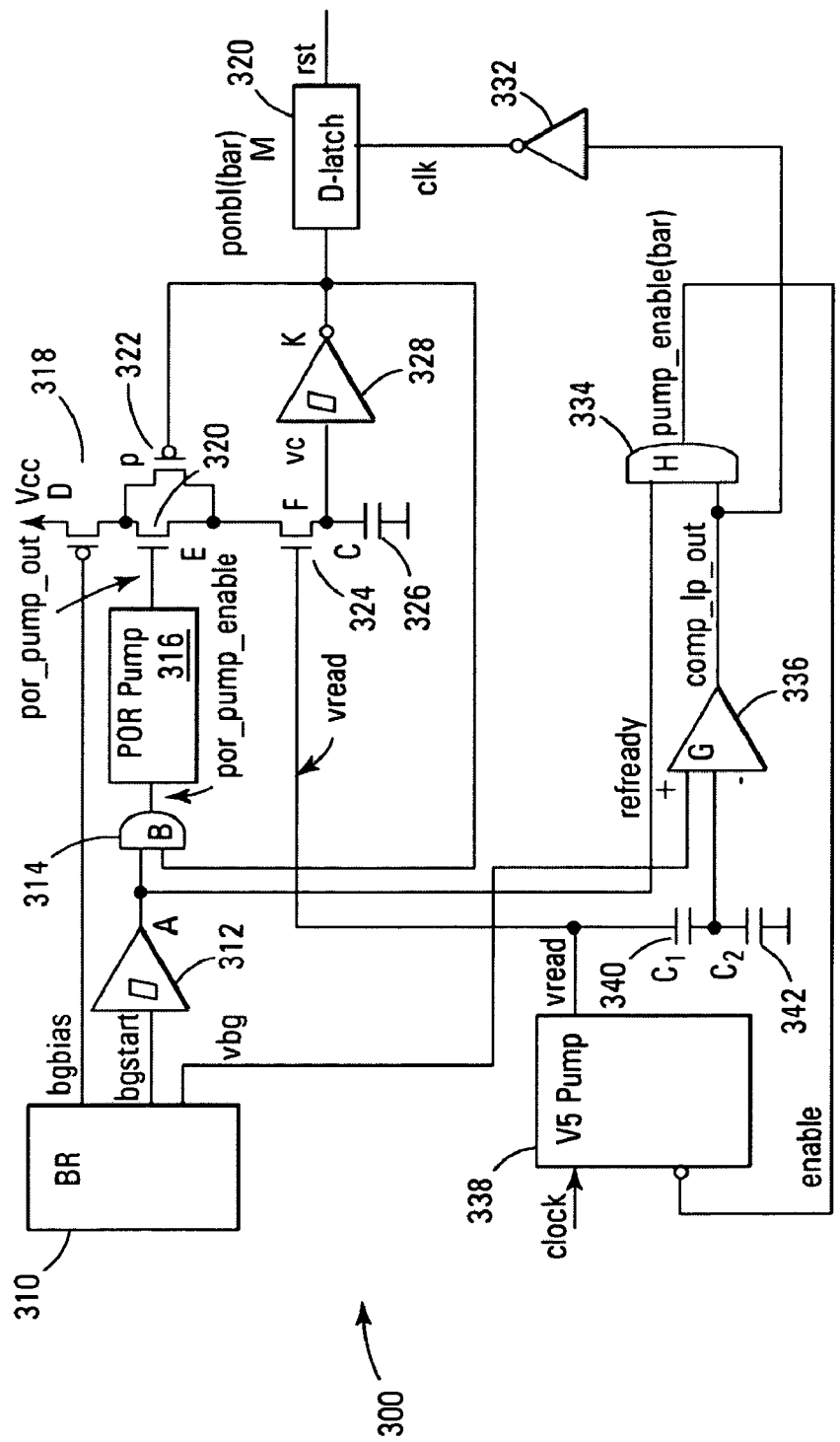
FIG. 3 is a more detailed block diagram of a POR circuit according to an embodiment of the invention.

Referring to FIG. 3, a more detailed block diagram of one embodiment of the present invention is described. The POR reset circuit 300 includes bandgap Reference (BR) block 310, which is a standard component in flash memory circuits. BR block 310 generates three signals used in the present invention. The first signal is bandgap reference voltage vbg which, in general, is also used as a reference voltage in other parts of the flash memory. BR block 310 also generates bgstart. At power up, bgstart rises following ramp up of Vcc until operation of the BR block 310 is triggered. BR block 310 also delivers vbg signal, the bandgap reference voltage. Only when bgstart reaches a given voltage level, i.e., once BR block 310 is triggered and vbg is generated, does bgbias become asserted.

Schmidt trigger 312 squares the signal bgstart in order to minimize rise time and outputs the signal refready. Refready is applied to AND gate 314. The other input of AND gate 314 is ponbl(bar). Ponbl(bar) senses the charge on capacitor 326 through Schmitt trigger 328. Schmitt trigger 328 outputs the opposite of the value of the voltage it senses. Thus, Schmitt trigger 328 is at logic "1" at the beginning of the operation, since capacitor 326 is discharged at the onset of the power up. Preferably, the trigger value of Schmidt trigger 328 is set at Vcc minus a few tenths of a volt, for example, 0.3V in the case of a low voltage flash memory. AND gate 314 outputs the signal por_pump_enable which is applied to activate POR Pump 316, described further below.

Referring now to transistors or switches 318, 320 and 324, and capacitor 326, these components together make up a switching circuit that charges capacitor 326 to Vcc but only after certain conditions in the flash memory circuit have been met, as will be explained. In order to charge capacitor 326, it is necessary that all three transistors 318, 320 and 324 be turned on. Preferably transistors 320 and 324 will be n-channel devices-channel devices, while transistor 318 will be a p-channel device.

Transistor 318 is turned on by bgbias. As noted, bgbias mirrors the current generated internally in BR 310, hence it is asserted only when BR 310 is activated. Transistor 318 functions to insure that capacitor 326 does not charge until BR 310 is activated. Monitoring bgbias alone, however, is not sufficient to ensure proper operation of the POR. If, for example, Vcc does not reach the $Vcc_{min}$ specified for chip operation (for example, 1.65V in the case of a very low voltage flash memory), but reaches a value less than $Vcc_{min}$ that is still sufficient to trigger BR 310 (for example, Vcc minus a few tenths of a volt), transistor 318 will still turn on, though perhaps not completely, and capacitor 326 will start to charge. Thus, transistors 320 and 324 only turn on after other circuit conditions required for proper operation have been met, as will be explained.

Pump 338 is a high efficiency pump used in the flash memory to generate the vread signal. Its operation will be familiar to those of ordinary skill in the art. The vread voltage value is around 5V. The vread signal is applied to the flash memory array (not shown) to read the flash memory cells in the array. It is most important to flash memory operation that vread be at the proper value since incorrect memory reading may otherwise occur. Pump 338 is regulated to its nominal value by a feedback loop including a capacitive voltage divider that includes capacitors 340 and 342, differential sensing device 336 and AND gate 334. The output vbg of the BR 310 is applied to the positive input of differential sensing device 336. The other input of differential sensing device 336 is taken from capacitive voltage divider of capacitors 340 and 342.

In normal steady state operation after completion of the power up, if for any reason vread is reduced in value, the output of differential sensing device 336, comp_lp_out, goes to logic "1." Comp_lp_out is input to AND gate 334. The other input to AND gate 334 is refready, the output of Schmitt trigger 312, and is already at "1." In other words, the output of AND gate 334, Pump_enable(bar) goes to "1" whenever comp_lp_out goes to logic "1" and BR block 310 is powered up. Pump_enable(bar) is fed back to enable pump 338 to allow more clock pulses to enter the Pump 338 thus increasing (and controlling) the output of pump 338, vread. Before BR block 310 is triggered and refready (vbg) goes to "1", comp_lp_out is at logic "1" following the Vcc ramp. However, pump_enable(bar) cannot go to "1" at this time, because refready is not yet active. Hence the Pump 338 cannot be activated. Only after the BR block 310 is switched on, vbg and refready are present, and pump_enable(bar) is at "1," can Pump 338 start ramping to generate vread. In other words, the AND gate 334 insures that Pump 338 is quiet until BR block 310 is triggered. As a consequence, vread will start to ramp only after refready is at "1".

The signal vread is the second signal gating the charging circuit of capacitor 326 via transistor 324. This signal alone would not be sufficient for correct POR operation. In fact, vread may reach an intermediate voltage able to turn on transistor 324 when Vcc is still less than $Vcc_{min}$. The gating action of transistor 324 increases the safety of the POR. If vread is not present, transistor 324 cannot be turned on and capacitor 326 cannot be charged.

The POR Pump 316 delivers the third signal needed to charge capacitor 326. The POR Pump 316 is preferably a low-efficiency pump made by a simple standard voltage multiplier, where no attempt is made to compensate it for the natural loss of one Vt to start operation, typical of such circuits. No output at all is generated until Vcc is greater than at least one Vt of the n-channel transistors used in the pump. This introduces a delay in the output of POR Pump 316, por_pump_out, insuring that transistor 320 is turned on only after a given delay due to the inefficiency of the pump.

Although a logic delay circuit could be used, it should be noted that the delay provided by a pump such as POR pump 316 is preferable because transistor 320 should be driven by a voltage well above Vcc to insure that the voltage drop across transistor 320 is held to a minimum so that capacitor 326 is charged to the full value of Vcc.

In summary, the following conditions at least are met for power-on reset transition to occur:
1. BR block 310 is triggered thus switching on transistor 318;
2. vread reaches a voltage at least higher than one Vt of the n-channel transistor 324;
3. Vcc reaches a voltage at least one Vt higher than the turn on of an n-channel transistor before capacitor 326 slowly starts to be charged.
4. Once the voltage on capacitor 326, vc, reaches the threshold of Schmidt trigger 328, set typically at Vcc−0.3 V, the Schmidt trigger output ponbl(bar) goes to "0". This is still not sufficient to generate a useful transition ("1" to "0") of the rst signal, which is ramping along with Vcc at logic "1", thereby resetting all the flash memory. In order to get rst to "0", which actually enables the memory for operation, ponbl(bar) must be latched into D-latch 330, by the output of inverter 332, clk when it reaches "1". This condition happens only when the output of a differential sensing device such as differential sensing device 336, comp_lp_out, goes to "0", i.e. after vread has reached the nominal regulated value, as determined by vbg and by the capacitive voltage divider of capacitor 340 and 342. The capacitive voltage divider is, of course, necessary to reduce vread to match the nominal voltage of vbg, the other input to differential sensing device 336. If, for any reason, clk should arrive before ponbl(bar), rst will be transitioned to "0" by ponbl(bar) and not by clk. In other word, the transition to "0" of rst is determined by ponbl (bar) or by clk, whichever occurs last. In either case, rst is reset to the logic level "0" only after Vcc has reached at least a minimum value first to trigger BR 310, then to activate POR pump 316 and Vread has reached its nominal value. Thus, the POR reset circuit of the present invention insures proper start up of the memory after the power up.

Figure 4:
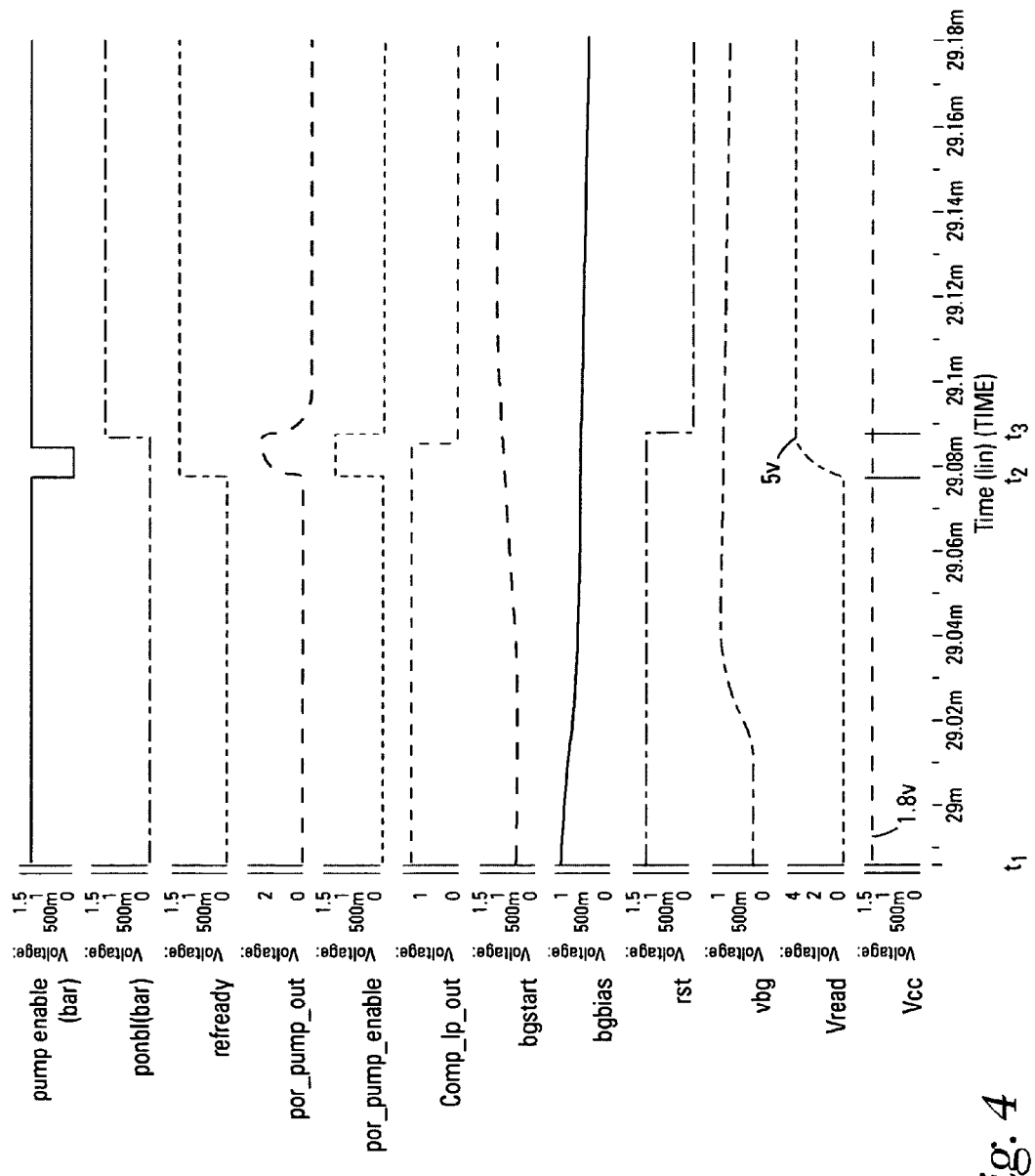
FIG. 4 is a timing diagram of the operation of a circuit according to an embodiment of the invention, showing voltage waveforms from the moment that Vcc ramps to a level sufficient to activate the voltage reference block until the power-on reset signal has been transitioned to "0."

FIG. 4 shows an example of a timing diagram illustrating the sequence of voltage waveforms of the circuit operation just described. At $t_1$ Vcc has already ramped to a level sufficient to activate BR block 310 (about 1.8 V) and vbg and bgstart ramp. After bgstart reaches a level sufficient to trigger refready from Schmitt trigger 312 at $t_2$, pump_enable (bar) transitions and vread rises in response. Por_pump_enable then can transition in response to refready and por_pmp_out rises. As can be seen, at this time por_pump_out, vread and bgbias are all at levels sufficient to turn on series connected transistors 318, 322 and 324, thus allowing capacitor 326 to charge to Vcc. At about $t_3$, vread has reached its nominal value and comp_lp_out and pump_enable(bar) will transition. After the voltage on capacitor 326 has reached a level sufficient to trigger Schmitt trigger 328, ponl(bar) will transition and will be latched into latch 330 by comp_lp_out (bar) and rst will go to zero.

In order to avoid unnecessary power consumption, after the transition from "1" to "0" of rst, once ponbl(bar) goes to "0", POR Pump 316 is no longer enabled (since the output of Schmitt Trigger 328 will be "0" and the output por_pump_enable of the AND gate 214 will go to "0". The Ponbl(bar) signal is also used to turn on the p-channel transistor 322, which bypasses transistor 320 in keeping capacitor 326 charged to Vcc, thus effectively latching ponbl(bar) to "0". Since the POR Pump 316 is no longer enabled it will not draw any more current while POR pump_out goes slowly to "0".

With respect to other POR circuits that work only in a given range of Vcc ramp, those of ordinary skill in the art will recognize that the POR circuit of the present invention is robust enough to work properly with different slopes of the Vcc ramp, and with $Vcc_{min}$ as low as, for example, 1.4V.

CONCLUSION

A POR reset circuit is disclosed. One embodiment includes a sensing circuit that determines when integrated circuit voltages and/or currents have reached predetermined levels and provides at least one trigger signal in response thereto, a delay circuit that introduces a delay in at least one of the trigger signals to provide time for selected voltages of the integrated circuit to reach nominal values before a POR reset signal transition takes place, a switching circuit that switches in response to signals including trigger signals from the sensing circuit and the delay circuit and generates a signal for operating a power-on reset signal. In another aspect of the present invention, the POR reset circuit includes a power saver latch that deactivates current consuming components of the POR circuit after the power-on reset signal transition has taken place.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method for providing a reset signal to an integrated circuit, the method comprising:
    selectively activating a first switch in response to a first reference signal;
    selectively activating a second switch in response to at least a second reference signal and a voltage at a first capacitor;
    selectively activating a third switch in response to an operational voltage, wherein the operational voltage is generated in response to at least the second reference signal and a third reference signal;
    charging the first capacitor upon activating the first, second and third switches;
    generating the reset signal in response to the operational voltage reaching a first predetermined value and a voltage at the first capacitor reaching a second predetermined value.

2. The method of claim 1, wherein selectively activating a second switch in response to at least a second reference signal and a voltage at a first capacitor further comprises using the second reference signal and the voltage at the first capacitor to enable a first charge pump and selectively activating the second switch in response to an output of the first charge pump.

3. The method of claim 2, wherein enabling the first charge pump further comprises enabling the first charge pump when the second reference signal has a voltage level corresponding to a logic high and when the voltage at the first capacitor has a voltage level corresponding to a logic low.

4. The method of claim 2, wherein enabling the first charge pump further comprises:

generating a first signal indicative of a logic level of the second reference signal;
  generating a second signal indicative of an inverted logic level of the voltage at the first capacitor; and
  enabling the first charge pump when logic levels of the first signal and the second signal are both high.

5. The method of claim 4, wherein generating a first signal indicative of a logic level of the second reference signal comprises applying a Schmidt trigger to the second reference signal.

6. The method of claim 4, wherein generating a second signal indicative of an inverted logic level of the voltage at the first capacitor comprises applying an inverted Schmidt trigger to the voltage at the first capacitor.

7. The method of claim 1, further comprising:
  selectively disabling the second switch in response to the voltage at the first capacitor reaching the second predetermined level; and
  selectively enabling a fourth switch bypassing the second switch in response to the voltage at the first capacitor reaching the second predetermined level.

8. The method of claim 1, wherein the first predetermined value is a nominal value of the operational voltage and the second predetermined value is less than a supply voltage of the memory device.

9. The method of claim 8, wherein the second predetermined value is the supply voltage minus approximately 0.3V.

10. The method of claim 1, further comprising:
  generating the reset signal in response to the operational voltage reaching a first predetermined value if the voltage at the first capacitor has already reached the second predetermined value or in response to the voltage at the first capacitor reaching the second predetermined value if the operational voltage has already reached the first predetermined value.

11. The method of claim 1, wherein generating the reset signal further comprises generating the reset signal using a D-latch having a first input coupled to receive a signal indicative of the operational voltage and a second input coupled to receive a signal indicative of the voltage at the first capacitor.

12. The method of claim 1, further comprising generating the first, second and third reference signals using a bandgap voltage generator.

13. A method for providing a reset signal to an integrated circuit, the method comprising:
  selectively activating a first switch in response to a first reference signal;
  selectively activating a first charge pump in response to at least a second reference signal;
  selectively activating a second charge pump in response to at least the second reference signal and a third reference signal;
  selectively activating a second switch in response to an output of the first charge pump;
  selectively activating a third switch in response to an output of the second charge pump;
  charging a first capacitor upon activating the first, second and third switches;
  selectively disabling the first charge pump in response to a voltage at the first capacitor reaching a first predetermined level; and
  generating the reset signal at a time of selectively disabling the first charge pump or at time of an output voltage of the second charge pump reaching a second predetermined level, whichever occurs last.

14. The method of claim 13, wherein selectively activating a first charge pump in response to at least a second reference signal further comprises selectively activating the first charge pump in response to the second reference signal and the voltage at the first capacitor.

15. The method of claim 14, wherein selectively activating the first charge pump further comprises:
  generating a first signal indicative of a logic level of the second reference signal;
  generating a second signal indicative of an inverted logic level of the voltage at the first capacitor; and
  activating the first charge pump when logic levels of the first signal and the second signal are both high.

16. The method of claim 15, wherein generating a first signal indicative of a logic level of the second reference signal comprises applying a Schmidt trigger to the second reference signal.

17. The method of claim 15, wherein generating a second signal indicative of an inverted logic level of the voltage at the first capacitor comprises applying an inverted Schmidt trigger to the voltage at the first capacitor.

18. The method of claim 13, further comprising:
  selectively enabling a fourth switch bypassing the second switch in response concurrently with disabling the first charge pump.

19. A memory device, comprising:
  an array of memory cells;
  a controller for controlling access to the array of memory cells;
  a power-on reset circuit for providing a reset signal for resetting the controller;
  a reference voltage generator; and
  a first charge pump for generating a voltage for accessing the array of memory cells;
  wherein the power-on reset circuit comprises:
    a first switch responsive to a first reference signal from the reference voltage generator;
    a second switch responsive to an output of a second charge pump;
    a third switch responsive to an output of the first charge pump;
    wherein the output of the second charge pump is responsive to a second reference signal from the reference voltage generator and a voltage at a first capacitor;
    wherein the output of the first charge pump is responsive to at least the second reference signal and a third reference signal from the reference voltage generator; and
    wherein charging of the first capacitor begins when the first, second and third switches are all activated.

20. The memory device of claim 19, wherein the power-on reset circuit transitions a reset signal upon the last occurring event selected from the group consisting of the voltage at the first capacitor reaching a first predetermined value and a voltage output of the first charge pump reaching a second predetermined value.

21. The memory device of claim 19, further comprising:
  a latch having a first input for receiving a first signal indicative of whether the voltage at the first capacitor has reached a first predetermined value, having a second input for receiving a second signal indicative of whether the voltage for accessing the array of memory cells has reached a second predetermined value and having an output for providing the reset signal.

22. The memory device of claim 21, wherein the latch is adapted to transition the reset signal at the latter of the voltage at the first capacitor reaching the first predetermined value and the voltage for accessing the array of memory cells reaching the second predetermined value.

23. A memory device, comprising:
an array of memory cells;
a controller for controlling access to the array of memory cells;
a power-on reset circuit for providing a reset signal for resetting the controller; and
a first charge pump for generating a read voltage for accessing the array of memory cells;
wherein the power-on reset circuit comprises:
  a first transistor having a gate coupled to receive a first reference signal;
  a first Schmidt trigger having an input coupled to receive a second reference signal;
  a first AND gate having a first input coupled to receive an output of the first Schmidt trigger;
  a second charge pump having an input coupled to receive an output of the first AND gate;
  a second transistor coupled in series with the first transistor and having a gate coupled to receive an output of the second charge pump;
  a third transistor coupled in series with the second transistor and having a gate coupled to receive an output of the first charge pump;
  a first capacitor in series with the third transistor;
  an inverted second Schmidt trigger having an input coupled between the third transistor and the first capacitor and having an output coupled to a second input of the first AND gate;
  a fourth transistor coupled in parallel with the second transistor and having a gate coupled to the output of the inverted second Schmidt trigger;
  a second capacitor coupled to the output of the first charge pump;
  a third capacitor coupled in series with the second capacitor;
  a differential sensing device having a first input coupled between the second and third capacitors and having a second input coupled to receive a third reference signal;
  a second AND gate having a first input coupled to receive the output of the first Schmidt trigger, having a second input coupled to receive an output of the differential sensing device and having an output coupled to the first charge pump;
  an inverter having an input coupled to the output of the differential sensing device; and
  a latch having a first input coupled to the output of the inverted second Schmidt trigger, having a second input coupled to an output of the inverter and having an output for providing the reset signal.

24. The memory device of claim 23, wherein each Schmidt trigger is triggered at a voltage level less than a supply voltage.

25. The memory device of claim 24, wherein each Schmidt trigger is triggered at a voltage level approximately 0.3V less than the supply voltage.

26. The memory device of claim 23, wherein the first charge pumped is selectively enabled in response to the output of the second AND gate.

27. The memory device of claim 23, wherein the second capacitor and the third capacitor are sized to reduce the output of the first charge pump to be approximately equal to a voltage level of the third reference signal when the read voltage is at its nominal value.

28. A computer system, comprising:
a processor; and
a memory device coupled to the processor, the memory device comprising:
  an array of memory cells;
  a controller for controlling access to the array of memory cells;
  a power-on reset circuit for providing a reset signal for resetting the controller;
  a reference voltage generator; and
  a first charge pump for generating a voltage for accessing the array of memory cells;
  wherein the power-on reset circuit comprises:
    a first switch responsive to a first reference signal from the reference voltage generator;
    a second switch responsive to an output of a second charge pump;
    a third switch responsive to an output of the first charge pump;
    wherein the output of the second charge pump is responsive to a second reference signal from the reference voltage generator and a voltage at a first capacitor;
    wherein the output of the first charge pump is responsive to at least the second reference signal and a third reference signal from the reference voltage generator; and
    wherein charging of the first capacitor begins when the first, second and third switches are all activated.

29. The computer system of claim 28, wherein the power-on reset circuit transitions a reset signal upon the last occurring event selected from the group consisting of the voltage at the first capacitor reaching a first predetermined value and a voltage output of the first charge pump reaching a second predetermined value.

30. The computer system of claim 28, further comprising:
a latch having a first input for receiving a first signal indicative of whether the voltage at the first capacitor has reached a first predetermined value, having a second input for receiving a second signal indicative of whether the voltage for accessing the array of memory cells has reached a second predetermined value and having an output for providing the reset signal.

31. The computer system of claim 30, wherein the latch is adapted to transition the reset signal at the latter of the voltage at the first capacitor reaching the first predetermined value and the voltage for accessing the array of memory cells reaching the second predetermined value.

32. A computer system, comprising:
a processor; and
a memory device coupled to the processor, the memory device comprising:
  an array of memory cells;
  a controller for controlling access to the array of memory cells;
  a power-on reset circuit for providing a reset signal for resetting the controller; and
  a first charge pump for generating a read voltage for accessing the array of memory cells;
  wherein the power-on reset circuit comprises:
    a first transistor having a gate coupled to receive a first reference signal;
    a first Schmidt trigger having an input coupled to receive a second reference signal;
    a first AND gate having a first input coupled to receive an output of the first Schmidt trigger;

a second charge pump having an input coupled to receive an output of the first AND gate;

a second transistor coupled in series with the first transistor and having a gate coupled to receive an output of the second charge pump;

a third transistor coupled in series with the second transistor and having a gate coupled to receive an output of the first charge pump;

a first capacitor in series with the third transistor;

an inverted second Schmidt trigger having an input coupled between the third transistor and the first capacitor and having an output coupled to a second input of the first AND gate;

a fourth transistor coupled in parallel with the second transistor and having a gate coupled to the output of the inverted second Schmidt trigger;

a second capacitor coupled to the output of the first charge pump;

a third capacitor coupled in series with the second capacitor;

a differential sensing device having a first input coupled between the second and third capacitors and having a second input coupled to receive a third reference signal;

a second AND gate having a first input coupled to receive the output of the first Schmidt trigger, having a second input coupled to receive an output of the differential sensing device and having an output coupled to the first charge pump;

an inverter having an input coupled to the output of the differential sensing device; and a latch having a first input coupled to the output of the inverted second Schmidt trigger, having a second input coupled to an output of the inverter and having an output for providing the reset signal.

33. The computer system of claim 32, wherein each Schmidt trigger is triggered at a voltage level less than a supply voltage.

34. The computer system of claim 33, wherein each Schmidt trigger is triggered at a voltage level approximately 0.3V less than the supply voltage.

35. The computer system of claim 32, wherein the first charge pumped is selectively enabled in response to the output of the second AND gate.

36. The computer system of claim 32, wherein the second capacitor and the third capacitor are sized to reduce the output of the first charge pump to be approximately equal to a voltage level of the third reference signal when the read voltage is at its nominal value.

* * * * *